US009401745B1

(12) United States Patent
Abdulla

(10) Patent No.: US 9,401,745 B1
(45) Date of Patent: Jul. 26, 2016

(54) WIRELESS COMMUNICATION LINK USING NEAR FIELD COUPLING
(75) Inventor: Mostafa Naguib Abdulla, Rancho Cordova, CA (US)
(73) Assignee: Micron Technology, Inc., Boise, ID (US)
(*) Notice: Subject to any disclaimer, the term of this patent is extended or adjusted under 35 U.S.C. 154(b) by 616 days.
(21) Appl. No.: 12/635,961
(22) Filed: Dec. 11, 2009
(51) Int. Cl.
*H04B 5/00* (2006.01)
*H04B 5/02* (2006.01)
*G11C 5/04* (2006.01)
(52) U.S. Cl.
CPC .. *H04B 5/02* (2013.01); *H04B 5/00* (2013.01); *G11C 5/04* (2013.01)
(58) Field of Classification Search
CPC ........ H04B 5/02; H04B 5/0012; H04B 5/00; H01L 224/48091; G11C 5/04; G11C 7/1075
USPC .............. 455/41.1, 41.2, 41.3, 558, 73, 90.3
See application file for complete search history.

(56) References Cited

U.S. PATENT DOCUMENTS

| | | | | |
|---|---|---|---|---|
| 5,621,913 A * | 4/1997 | Tuttle et al. | ........ | G06K 19/0701 327/564 |
| 5,727,972 A * | 3/1998 | Aldous et al. | .................. | 439/655 |
| 5,754,948 A * | 5/1998 | Metze | ...................... | H04B 7/00 455/41.2 |
| 6,396,449 B1 * | 5/2002 | Osterhues et al. | ........ | H01Q 3/44 343/754 |
| 6,864,848 B2 * | 3/2005 | Sievenpiper | ............. | H01Q 9/14 343/767 |
| 7,068,234 B2 * | 6/2006 | Sievenpiper | ............. | H01Q 3/26 343/745 |
| 7,088,964 B2 * | 8/2006 | O | ............................ | H01Q 1/38 257/725 |
| 7,617,342 B2 * | 11/2009 | Rofougaran | ......... | H01Q 1/2275 235/492 |
| 2004/0124248 A1 * | 7/2004 | Selker | ................. | G06K 19/0716 235/492 |
| 2006/0071794 A1 * | 4/2006 | Sayers et al. | ........... | H01Q 1/246 340/572.7 |
| 2006/0211380 A1 * | 9/2006 | McConnell | ............. | H01L 23/48 455/73 |
| 2007/0136537 A1 * | 6/2007 | Doblar | ................ | G06F 13/1684 711/154 |
| 2008/0115006 A1 * | 5/2008 | Smith | ...................... | G06F 1/08 713/601 |
| 2008/0150111 A1 * | 6/2008 | Hiller | ...................... | H01L 24/49 257/686 |
| 2008/0248802 A1 * | 10/2008 | Krishnamoorthy | ........... | 455/445 |
| 2008/0272972 A1 * | 11/2008 | Kanno | ................... | H01Q 3/247 343/767 |
| 2008/0318524 A1 * | 12/2008 | Rofougaran | ......... | H01Q 1/2225 455/41.1 |
| 2009/0085223 A1 * | 4/2009 | Nishiyama | .......... | H01L 23/3121 257/777 |
| 2009/0117855 A1 * | 5/2009 | Rofougaran | ............ | H01L 23/66 455/73 |
| 2009/0195469 A1 * | 8/2009 | Lim | ....................... | H01Q 21/24 343/770 |
| 2009/0231225 A1 * | 9/2009 | Choudhury | .............. | H01Q 3/26 343/770 |
| 2009/0243813 A1 * | 10/2009 | Smith | .............. | G06K 19/07716 340/10.51 |
| 2009/0267848 A1 * | 10/2009 | Kuroda | ................ | H01Q 1/2283 343/720 |
| 2009/0322643 A1 * | 12/2009 | Choudhury | .......... | H01Q 1/2291 343/851 |
| 2010/0054072 A1 * | 3/2010 | Stansfield | ................. | G11C 8/14 365/230.03 |
| 2010/0109141 A1 * | 5/2010 | Nishiyama | ............... | H01L 24/48 257/690 |
| 2010/0121994 A1 * | 5/2010 | Kim | ..................... | G06F 13/1684 710/51 |
| 2010/0238693 A1 * | 9/2010 | Jeddeloh | ............. | G06F 13/4234 365/51 |
| 2010/0253572 A1 * | 10/2010 | Hardacker | ............. | H01Q 3/267 342/174 |
| 2010/0328047 A1 * | 12/2010 | Jantunen | .............. | G06K 7/0008 340/10.4 |
| 2011/0040909 A1 * | 2/2011 | Abdulla | .................... | G11C 5/02 710/71 |
| 2011/0255352 A1 * | 10/2011 | Kuroda | ............ | G06K 19/07749 365/191 |
| 2012/0290760 A1 * | 11/2012 | McCormack | ........ | H04B 5/0037 710/303 |
| 2013/0009848 A1 * | 1/2013 | Plettemeier | ............. | H01L 23/66 343/893 |
| 2013/0031315 A1 * | 1/2013 | Abdulla | .................... | G06F 13/16 711/149 |
| 2013/0091312 A1 * | 4/2013 | Ken | ........................ | G06F 13/42 710/106 |
| 2013/0182513 A1 * | 7/2013 | Eom | .................. | H03K 19/0005 365/189.07 |
| 2013/0183903 A1 * | 7/2013 | McCormack | ............ | H04B 1/40 455/41.2 |
| 2014/0008447 A1 * | 1/2014 | Deavours | ......... | G06K 19/07773 235/492 |

OTHER PUBLICATIONS

Mostafa Naguib Abdulla, U.S. Appl. No. 12/542,528, filed Aug. 17, 2009 entitled "High-Speed Wireless Serial Communication Link for a Stacked Device Configuration Using Near Field Coupling".

\* cited by examiner

*Primary Examiner* — Md Talukder
(74) *Attorney, Agent, or Firm* — Dorsey & Whitney LLP

(57) ABSTRACT

A memory device may include an array of closely spaced memory integrated circuits that communicate wirelessly over at least two frequencies using near field coupling.

18 Claims, 3 Drawing Sheets

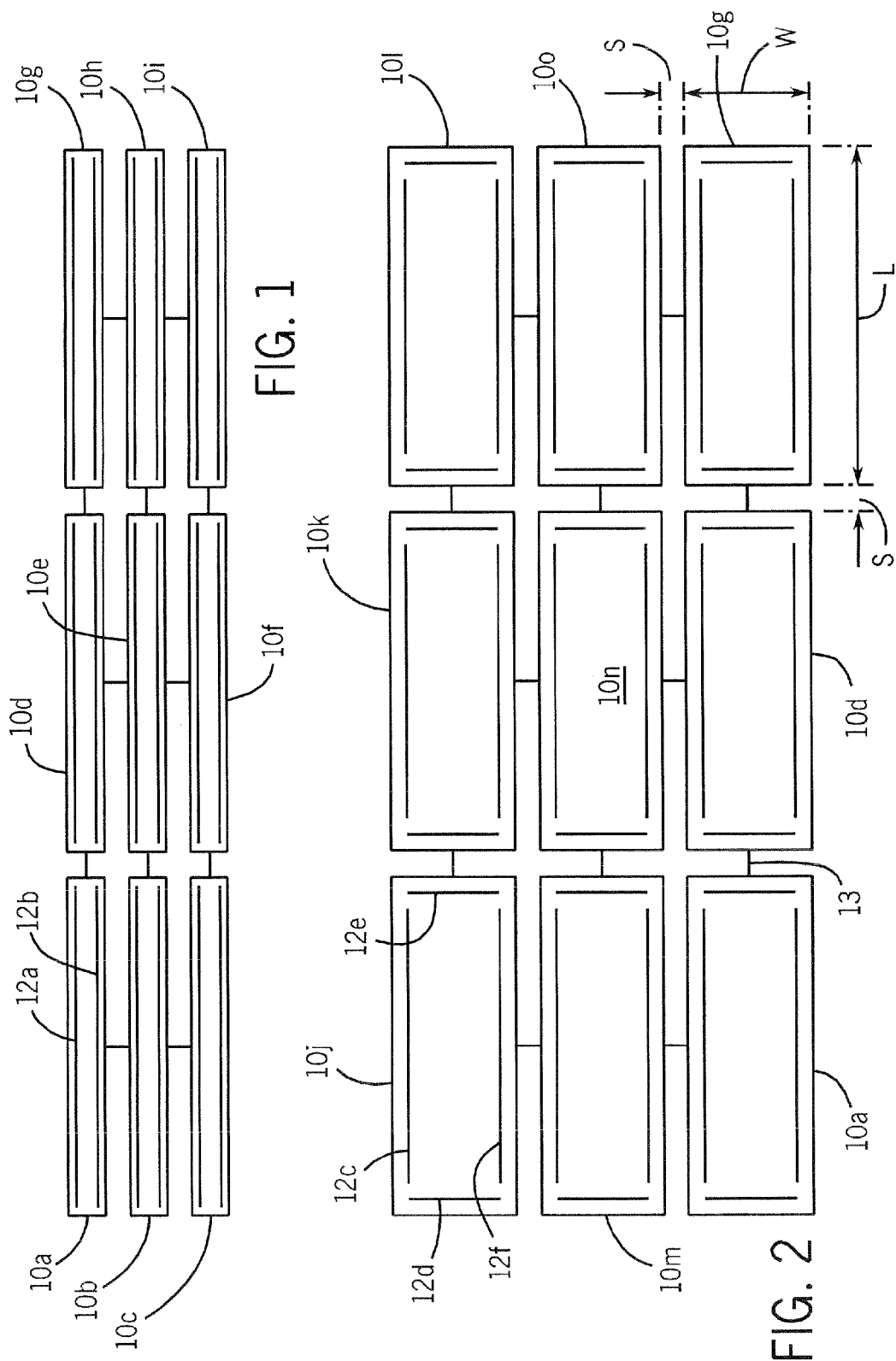

WIRELESS COMMUNICATION LINK USING NEAR FIELD COUPLING

BACKGROUND

With current demand for high density memory, die stacking technology is one solution to achieve a desired density. However, die stacking places many devices in parallel, which produces a capacitive loading effect that adversely reduces the bus bandwidth and limits the amount of data that can be transferred through a data link. There is a need for a viable solution that provides high density without reducing the maximum allowable data rate on a bus due to loading.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1 is a side elevational view of a stack of memory integrated circuit in accordance with one embodiment of the present invention;

FIG. 2 is a top plan view of the embodiment shown in FIG. 1 in accordance with one embodiment of the present invention;

Figure 3:
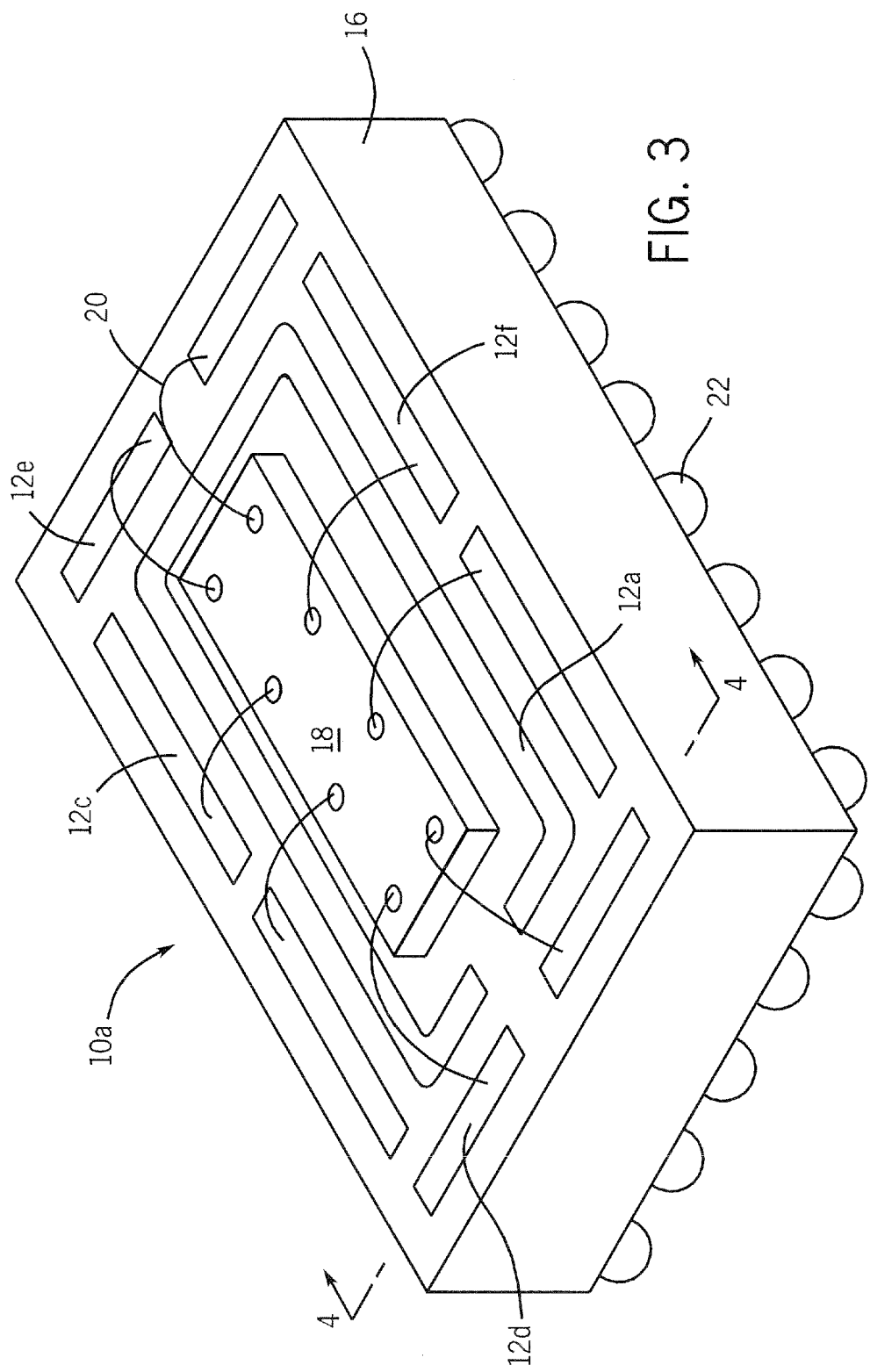
FIG. 3 is a perspective view of one memory chip in accordance with one embodiment of the present invention.

It will be appreciated that for simplicity and clarity of illustration, elements illustrated in the figures have not necessarily been drawn to scale. For example, the dimensions of some of the elements may be exaggerated, relative to other elements, for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without the specific details. In other instances, well known methods, procedures, components and circuits have not been described in detail so as not to obscure the present invention.

Use of the terms "coupled" and "connected", along with their derivatives, are not intended as synonyms for each other. Rather, in particular embodiments, "connected" may be used to indicate that two or more elements are in direct physical or electrical contact with each other. "Coupled" may be used to indicate that two or more elements are either in direct or indirect (with other intervening elements between them) physical or electrical contact with each other, and/or that the two or more elements cooperate or interact with each other (e.g. as in a cause and effect relationship).

An array of memory elements, shown in FIG. 1, may include a 3×3×3 array of memory integrated circuits. However, any size of array may be produced. Moreover, the height, depth, and length of the array does not have to be equal in all cases. The array may be planar rather than three dimensional or may be a single stack of a plurality of circuits.

In some embodiments, the array may itself be a packaged or molded unit that can be secured to a circuit board as one integrated element. In other embodiments, it may be built up from pieces on a substrate.

In the embodiment illustrated in FIG. 1, the 3×3×3 array includes memory integrated circuits 10a-10i. Each of these circuits may be coupled electrically to each of at least two neighbors in one embodiment. As depicted, each memory integrated circuit 10 also includes an upper loop antenna 12a and a lower loop antenna 12b. The upper loop antenna 12a couples with an overlying loop antenna 12b in an overlying memory chip, while the lower loop antenna 12b couples with an underlying memory element having an adjacent loop antenna 12a.

In some embodiments, the coupling may be near field coupling. The near field coupling may be tuned to the spacing or distance between adjacent face-to-face abutted memory elements to reduce interference. In some embodiments, the distance between adjacent or neighboring near field coupled memory integrated circuits is much smaller than dimensions of individual memory circuits. For example, the distance between near field coupled antennas may be on the order of about one millimeter, in one embodiment, whereas dimensions of the integrated circuit packages may be on the order of ten millimeters or greater in one non-limiting example.

By tuning the antennas in the associated receiving and transmitting circuits to the near field range that corresponds to the distance between integrated circuits, interference with other transversely oriented antennas and more widely spaced antennas associated with distant memory integrated circuits may be reduced in some embodiments. Generally, sufficient coupling will only be present between parallelly aligned loop antennas or, particularly, in the case where each of the loop antennas lies generally in a plane, where the planes of closely adjacent loop antennas are generally parallel. This, too, greatly reduces interference since transverse antennas lying in transverse planes will not significantly affect communications between closely spaced antennas in substantially parallel planes, for example.

Thus, in some embodiments, signals may be passed between memory integrated circuits using electromagnetic radiation. However, signals may also be passed through interconnections in the form of connectors 13. The connectors 13, in some embodiments, may carry power and ground planes. In other embodiments, interconnections may provide other signals. In some embodiments, these connectors 13 may be implemented through integrated circuit connectors, such as solder balls, pins, wire bonds, and lands, to mention a few examples.

In some embodiments, the signals passing between the distributed memory integrated circuits 10 use near field electromagnetic technology via loop antennas to eliminate the need for direct electrical contact in providing inter die communication. Serial data links using the over-the-air transmission may be responsible for delivery and/or verifying that correct data was transmitted from, for example, a memory controller, to any of the devices within the array. Support to detect errors or loss data triggers retransmission until the data is verified as being correct and received completely in one embodiment.

Thus, in one embodiment, a memory controller may be placed relatively centrally within the array to facilitate communication with the other devices. Information transmitted from the memory controller in the center of the array, in one embodiment, may be transferred bucket brigade style throughout the array from device to device.

Referring to FIG. 2, the array, shown in FIG. 1, also has a depth into the page, in one embodiment, and includes a plurality of devices connected by connectors 13 and coupled by loop antennas 12. Particularly, as an example, the near field antennas 12c and 12f are coupled between adjacent devices in the same planar level of the stack shown in FIG. 1. Thus, an antenna 12f on the long dimension "L" of a memory integrated circuit 10 is coupled to an antenna 12c on the opposing long dimension of an adjacent memory integrated circuit. Likewise, antennas 12e and 12d communicate between adjacent neighbors along the short sides "W" of adjacent end-to-end memory integrated circuits 10.

As depicted in FIG. 2, the length of the memory integrated circuit packages L and the width W is substantially greater than the spacing between adjacent integrated circuits indicated as S.

Roughly speaking, the near field is a region within a radius R, much less than the wavelength, while the far field is in the region where the radius R is much greater than the wavelengths. Near field may also sometimes be called near zone. Generally, the near field is part of the radiated field that is below distances greater than $S=D^2/(4\lambda)$ times the Fresnel parameter from the source of the diffracting edge or antenna of longitude of diameter D. The near field is separated from the far field by the Fresnel region.

Thus, by choosing the appropriate wavelength, the loop antenna systems may be tuned so that they are effectively keyed to the distance S between adjacent integrated circuits, reducing interference between from widely spaced antennas.

Referring to FIG. 3, in accordance with one embodiment, a memory integrated circuit, such as the circuit 10a, may include a plurality of connectors. In this case, the connectors that correspond to the connectors 13, shown in FIG. 2, may be implemented by solder balls 22, as one example. Each of the antennas 12 may be formed by a plated or printed conductive strip on or over an upper surface of a substrate 16, coupled to a via extending through the substrate 16, coupled to an internal conductive plated layer in one embodiment. Thus, a generally U-shaped loop antenna, such as the loop antennas 12c, 12d, 12e, and 12f, shown in FIG. 3, may be formed within the substrate 16.

Figure 4:
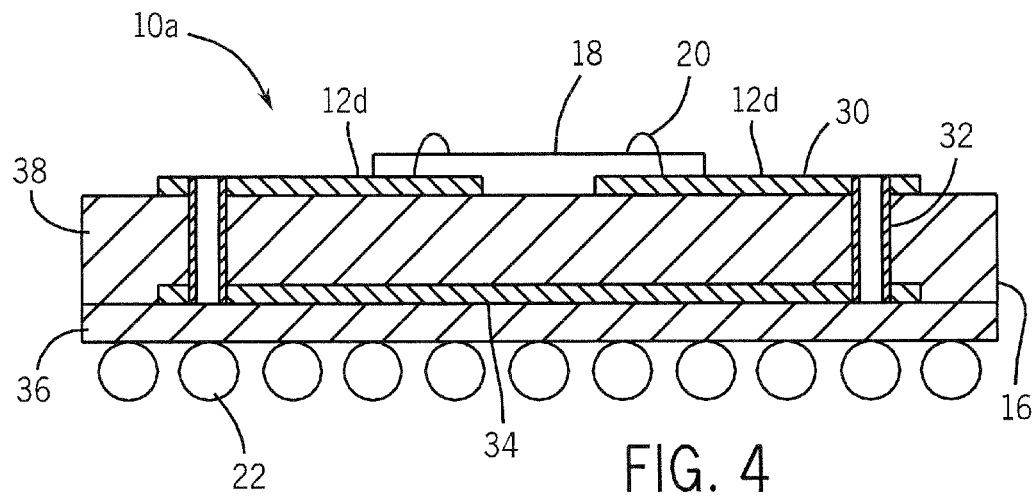
FIG. 4 is a cross-sectional view taken generally along the line 4-4 in FIG. 3.

In some embodiments, the substrate 16 may be formed of multiple layers 36 and 38, shown in FIG. 4, so that the plated conductors 34 may be covered by overlying material 36 and 38. The substrate 16 may be formed of a suitable dielectric material.

Referring back to FIG. 3, on the upper surface of the substrate 16, a loop antenna 12a may be formed and on the lower surface (not shown in FIG. 3) a loop antenna 12b may be formed. The loop antennas 12a and 12b may be simply plated, printed, or deposited on the upper surface between the antennas 12f, 12e, 12c, and 12d and an integrated circuit chip 18 in one embodiment. The integrated circuit chip 18 may be coupled by wire bonds 20 to the various loop antennas.

Thus, referring to the cross-sectional depiction in FIG. 4, it can be seen that, in one embodiment, a given loop antenna, such as the loop antenna 12d, is made up of a plating 30, coupled by vias 32 to plating 34 between substrate 16 portions 36 and 38. The portion 36 may be formed after deposition of the plating 38.

Figure 5:
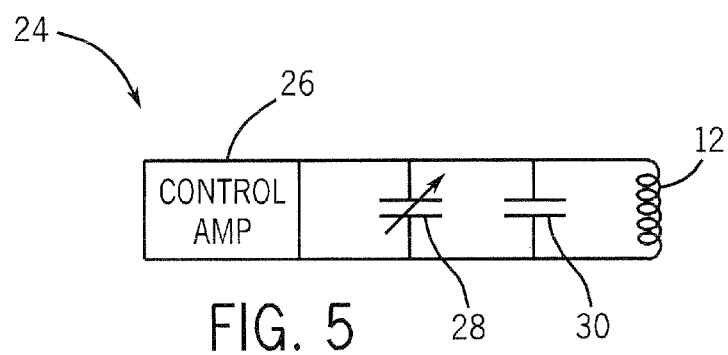
FIG. 5 is a circuit schematic for one embodiment of the present invention.

Referring to FIG. 5, in some embodiments, the integrated circuit 14 may include a control to control the transmission of electromagnetic energy from the loop antenna 12, illustrated as an inductor in FIG. 5. A control and power amplifier 26 may be coupled to parallel capacitors 28 and 30, which constitute the internal transceiver capacitances. One of the capacitances 28, in one embodiment, may be tunable so that the frequency at which the antenna transmits or receives may be altered. A suitable tunable capacitor may be implemented using any conventional technology. One technique for forming tunable capacitors is to use barium strontium titanate ferroelectric material as the dielectric material between two plates of an integrated circuit capacitor. The dielectric constant of the barium strontium titanate dielectric and, therefore, the capacitance value of the capacitor, can be adjusted by applying a DC voltage.

Thus, in some embodiments, a tunable frequency transmitter and receiver may be provided. This may be useful in a number of different situations. In one situation, depending on fabrication variations, it may be desirable to tune the frequency of the resulting device. However, in addition, it may be desirable that different devices, within the array, transmit using different frequencies interference. For example, in one embodiment, all of the devices within a given plane or level of the array may be use a first frequency, while the devices in the level above and the level below use a second frequency. Thus, each device may be programmed to use a particular frequency at all times or may be varied from time to time in order to reduce interference.

In addition, two different types of devices with two different fixed frequencies can also be used and the stack may be made up appropriately to reduce interference. That is, the array may be arranged so that devices that are most likely to cause interference communicate with different frequencies.

For example, within a given integrated circuit, the upper and lower loop antennas may be operated at different frequencies to reduce interference. Then they can be matched with neighboring devices that have the same frequencies with which to communicate. In some embodiments, more than two different frequencies may be provided.

The vertical vias 32 through the substrate 16 may be completed, in one embodiment, by drilling holes into molded material forming the substrate 20, and filling the vias with solder paste, electrically conductive adhesive, or any other electrically conductive materials. Alternatively, solder or metal pillars may be in place prior to the molding process, where a grinding process on the finished mold exposes a metal for electrical pads.

By now it should be apparent that embodiments of the present invention allow increased memory storage efficiencies by using features, either singlely or in combination, that allow data to be reliably transferred in a distributed memory system using near field coupling. The wireless interface provides a method of uploading code and transferring data in inter died communication, while maintaining the maximum allowable data rate.

While certain features of the invention have been illustrated and described herein, many modifications, substitutions, changes, and equivalents will now occur to those skilled in the art. It is, therefore, to be understood that the appended claims are intended to cover all such modifications and changes as followed in the true spirit of the invention.

What is claimed is:

1. A method comprising:
   enabling a memory integrated circuit to communicate wirelessly with a first neighboring memory integrated circuit over a first frequency, wherein the memory integrated circuit includes a physical electrical connection to the first neighboring memory integrated circuit, wherein the physical electrical connection provides signals other than those provided wirelessly, wherein the memory integrated circuit includes:

a substrate having an upper surface and a lower surface opposite to and distinct from the upper surface;
a first loop antenna on the upper surface;
a second loop antenna on the lower surface;
a third loop antenna formed within the substrate parallel and adjacent to an edge of the substrate;
wherein a portion of the third antenna extends over the upper surface and is coupled to a portion of the third antenna within the substrate by a first via and a second via extending through the substrate; and
a plurality of connectors coupled to the lower surface;
coupling an integrated circuit chip to the upper surface within a perimeter defined by the first antenna, wherein the integrated circuit chip is configured to tune frequencies of the first, second, or third antennas;
coupling at least one of the first, second, or third antenna of the memory integrated circuit to an antenna of the first neighboring memory integrated circuit, wherein the at least one antenna is within a near field region of the antenna of the first neighboring memory integrated circuit to reduce interference from other antennas, wherein the at least one antenna is coupled to the memory integrated circuit by wire bonds;
enabling the memory integrated circuit to communicate wirelessly with a second neighboring memory integrated circuit over a second frequency; and
coupling at least one of the first, second, or third antenna of the memory integrated circuit to an antenna of the second neighboring memory integrated circuit, wherein the at least one antenna is within the near field region of the antenna second neighboring memory integrated circuit to reduce interference from other antennas, wherein the at least one antenna coupled to the antenna of the second neighboring memory integrated circuit is different than the at least one antenna coupled to the antenna of the first neighboring memory integrated circuit.

2. The method of claim 1, further comprising forming at least one array of memory integrated circuits arranged generally in a plane.

3. The method of claim 2, further comprising arranging at least three of the at least one memory integrated circuit arrays in parallel planes, wherein each memory integrated circuit of each of the at least three memory integrated circuit arrays is configured to communicate wirelessly with each neighboring memory integrated circuit, wherein each neighboring memory integrated circuit communicates at a different frequency, wherein antennas of each neighboring memory integrated circuit configured to communicate wirelessly are in parallel planes.

4. The method of claim 3, further comprising forming physical electrical connections between neighboring memory integrated circuits of each of the at least three memory integrated circuit arrays.

5. The method of claim 1, further comprising forming an array of memory integrated circuits spaced from one another at a distance of approximately one millimeter.

6. The method of claim 1, further comprising forming a plurality of memory integrated circuits, each of the plurality of memory integrated circuits having a corresponding length and corresponding width, wherein a distance between adjacent memory integrated circuits is less than the corresponding length and the corresponding width of either of the adjacent memory integrated circuits.

7. The method of claim 1, further comprising providing at least one of a power signal or a reference signal from the memory integrated circuit to the first neighboring memory integrated circuit via the physical electrical connection.

8. The method of claim 1, further comprising:
coupling the integrated circuit chip to the first, second, or third antennas by wire bonds.

9. The method of claim 8, further comprising tuning the first, second, or third antennas to different frequencies.

10. The method of claim 1, wherein forming the first antenna includes plating of a conductive strip on the upper surface.

11. An apparatus comprising:
a substrate having an upper surface, a lower surface different from the upper surface, a first short edge, a second short edge, a first long edge, and a second long edge, wherein the edges define a perimeter of the substrate;
a first loop antenna on the upper surface and configured to couple to an antenna of a first memory integrated circuit adjacent to the upper surface;
a second loop antenna on the lower surface and configured to couple to an antenna of a second memory integrated circuit adjacent to the lower surface;
a third loop antenna formed within the substrate parallel to the first short edge and configured to couple to an antenna of a third memory integrated circuit adjacent to the first short edge;
a fourth loop antenna formed within the substrate parallel to the second short edge and configured to couple to an antenna of a fourth memory integrated circuit adjacent to the second short edge;
a fifth loop antenna formed within the substrate parallel to the first long edge and configured to couple to an antenna of a fifth memory integrated circuit adjacent to the first long edge;
a sixth loop antenna formed within the substrate parallel to the second long edge and configured to couple to an antenna of a sixth memory integrated circuit adjacent to the second long edge;
wherein a portion of each of the third, fourth, fifth, and sixth loop antennas extend over the upper surface and is coupled to a respective portion of the third, fourth, fifth, and sixth loop antennas within the substrate by a plurality of vias extending through the substrate;
a plurality of connectors coupled to the lower surface; and
an integrated circuit chip coupled to the upper surface within a perimeter defined by the first loop antenna, wherein the integrated circuit chip is further coupled to the first, second, third, fourth, fifth, and sixth loop antennas by wire bonds, wherein the integrated circuit chip is configured to tune frequencies of the loop antennas.

12. The apparatus of claim 11, wherein the integrated circuit chip includes a control and power amplifier coupled to a first and a second capacitor, wherein the first and second capacitor are coupled in parallel, wherein the second capacitor is tunable.

13. The apparatus of claim 11, wherein the first loop antenna is configured to couple to an additional loop antenna parallel to the first loop antenna, wherein the additional loop antenna is on a lower surface of the first memory integrated circuit positioned above the apparatus.

14. The apparatus of claim 11, wherein the first loop antenna is a plating of a conductive strip on the upper surface.

15. The apparatus of claim 11, wherein the apparatus is included in an array of apparatuses coupled by wire bonds, wherein the apparatuses are further configured to pass signals by electromagnetic radiation through loop antennas, wherein the loop antennas are in parallel planes, wherein the wire bonds provide signals between the apparatuses other than those provided by electromagnetic radiation.

16. The apparatus of claim 15, wherein the array of apparatuses is a three dimensional array.

17. The apparatus of claim 15, wherein the array of apparatuses is configured such that spacing between the apparatus and the first memory integrated circuit in the array is less than a dimension of the apparatuses.

18. The apparatus of claim 13, wherein the first loop antenna is coupled to the additional loop antenna by near field coupling.

* * * * *